(12) United States Patent  
Chen (10) Patent No.: US 7,185,297 B2
(45) Date of Patent: Feb. 27, 2007

(54) METHOD OF DIAGNOSING CIRCUIT LAYOUT AND COMPUTER SYSTEM FOR PERFORMING THE SAME

(75) Inventor: Tao Hung Chen, Taipei County (TW)

(73) Assignee: ASUSTeK Computer Inc., Taipei (TW)

( * ) Notice: Subject to any disclaimer, the term of this patent is extended or adjusted under 35 U.S.C. 154(b) by 222 days.

(21) Appl. No.: 10/947,308

(22) Filed: Sep. 23, 2004

(65) Prior Publication Data

US 2005/0107975 A1 May 19, 2005

(30) Foreign Application Priority Data

Nov. 18, 2003 (TW) .............................. 92132346 A (51) Int. Cl.
*G06F 17/50* (2006.01)
(52) U.S. Cl. ............................................ 716/5; 716/10
(58) Field of Classification Search .................... 716/5, 716/9–10
See application file for complete search history.

(56) References Cited

U.S. PATENT DOCUMENTS 6,516,452 B2 * 2/2003 Meding .......................... 716/5

2003/0145297 A1 * 7/2003 Cote et al. ..................... 716/6

* cited by examiner

*Primary Examiner*—Stacy A Whitmore
(74) *Attorney, Agent, or Firm*—Birch, Stewart, Kolasch & Birch, LLP (57) ABSTRACT

A method of diagnosing a circuit layout and a computer system for performing the method. First, a layout arranging rule is defined in a second file, and a circuit layout is defined in a first file. A diagnosing program compares the first file and the second file and checks whether the circuit layout violates the layout arranging rule. In addition, the diagnosing program searches the first file to determine if any groups of power test pads have a total number of power test pads which is less than a safety value, to indicate if any additional power test pads are required for any particular group. The diagnosing program also determines which test pads have an interval less than a safety distance, to indicate if any intervals of the test pads should be amended. The computer system can rapidly and exactly determine any problems in the arrangement of the test pads in the circuit layout, so as to save manpower and time.

17 Claims, 7 Drawing Sheets

FIG. 1

First file

| Part name | Pin number | Index | X coordinate of pin pad | Y coordinate of pin pad | Layer name | Net name | Nail(s) |
|---|---|---|---|---|---|---|---|
| U15 | 1 | A1 | 8.411 | −8.776 | 1 | PCI_CK_33M_LPC | ○ |
| U15 | 2 | A2 | 8.411 | −8.944 | 1 | FWH_INIT_R# | ○ |
| U15 | 3 | A3 | 8.332 | −8.776 | 1 | PCI_RST_FWH# | ○ |
| U15 | 4 | A4 | 8.332 | −8.944 | 1 | +3.3V | ○ |
| U15 | 5 | A5 | 8.254 | −8.776 | 1 | LPC_AD | ○ |
| U15 | 6 | A6 | 8.254 | −8.944 | 1 | FWH_ID0 | ○ |
| U15 | 7 | A7 | 8.175 | −8.776 | 1 | LPC_AD1 | ○ |
| U15 | 8 | A8 | 8.175 | −8.944 | 1 | +5V | ○ |
| U15 | 9 | A9 | 8.096 | −8.776 | 1 | LPC_AD2 | ○ |
| U15 | 10 | A10 | 8.096 | −8.944 | 1 | NC_LPC_DEBUG10 | ○ |
| U15 | 11 | A11 | 8.018 | −8.776 | 1 | LPC_AD3 | ○ |
| U15 | 12 | A12 | 8.018 | −8.944 | 1 | GND | ○ |
| U15 | 13 | A13 | 7.939 | −8.776 | 1 | LPC_FRAME# | ○ |
| U15 | 14 | A14 | 7.939 | −8.944 | 1 | GND | ○ |
| U15 | 15 | A15 | 8.372 | −8.86 | 1 | (NC) | ○ |
| U15 | 16 | A16 | 7.978 | −8.86 | 1 | (NC) | ○ |

FIG. 2

Third file

SHASTA-MLK-X00 FABMASTER (R)    licence    #5047    ASUSTEK COMPUTER INC,

| Nail(s) | Test 2492 | Fixture Nails, | Nails 1481 | | 2492/6028 Nets | Selected INCH | Drills units | | 26-Aug-03 | | | 10:51 |
|---|---|---|---|---|---|---|---|---|---|---|---|---|
| | X coordinate of test pad | Y coordinate of test pad | Test pad Type | Test pad grid | Test pad area | Net number | Net name | Group name | Virtual | Pin/Via |
| $0 | 6.965 | -8.4 | 1 | F7 | (B) | #944 | PCI_CK_33M_LPC | V | VIA | . |
| $0 | 8.39 | -9.02 | 1 | G8 | (B) | #946 | FWH_INIT_R# | V | VIA | . |
| $0 | 2.37 | -8.025 | 2 | B7 | (B) | #945 | PCI_RST_FWH# | V | VIA | . |
| $0 | 2.045 | -8.54 | 1 | B7 | (B) | #386 | +3.3V | V | VIA | . |
| $0 | 0.585 | -8.51 | 1 | A7 | (B) | #952 | LPC_AD0 | V | VIA | . |
| $0 | 8.32 | -8.405 | 2 | G7 | (B) | #947 | FWH_ID0 | V | VIA | . |
| $0 | 0.505 | -8.545 | 1 | A7 | (B) | #953 | LPC_AD1 | V | VIA | . |
| $0 | 7.03 | -7.915 | 1 | F7 | (B) | #948 | LPC_AD2 | V | VIA | . |
| $0 | 8.17 | -9.025 | 2 | G8 | (B) | #445 | +5V | V | VIA | . |
| $0 | 7.025 | -7.76 | 1 | F7 | (B) | #949 | LPC_AD3 | V | VIA | . |
| $0 | 8.025 | -6.84 | 3 | G6 | (B) | #389 | GND | V | VIA | . |
| $0 | 5.62 | -8.555 | 1 | E7 | (B) | #951 | LPC_FRAME# | V | VIA | . |
| $0 | 2.615 | -1.88 | 1 | C2 | (B) | #389 | GND | V | VIA | . |
| $0 | 2.47 | -6.033 | 1 | B5 | (B) | #0 | (NC) | PIN | DDR2.185 | . |
| $0 | 5.514 | -6.033 | 1 | E5 | (B) | #0 | (NC) | PIN | DDR2.186 | . |

FIG. 3

| Index | Suggestion | Priority |
|---|---|---|
| A1 | Control pin of EEPROM | Absolutely necessary |
| A2 | Control pin of EEPROM | Absolutely necessary |
| A3 | Control pin of EEPROM | Absolutely necessary |
| A4 | Control pin of EEPROM | Absolutely necessary |
| A5 | Control pin of EEPROM | Absolutely necessary |
| A6 | Input pin of tree | Not essential |
| A7 | Control pin of EEPROM | Absolutely necessary |
| A8 | Control pin of EEPROM | Absolutely necessary |
| A9 | Control pin of EEPROM | Absolutely necessary |
| A10 | Control pin of EEPROM | Absolutely necessary |
| A11 | Control pin of EEPROM | Absolutely necessary |
| A12 | Control pin of EEPROM | Absolutely necessary |
| A13 | Control pin of EEPROM | Absolutely necessary |
| A14 | Control pin of EEPROM | Absolutely necessary |
| A15 | Input pin of tree | Not essential |
| A16 | Input pin of tree | Not essential |

Second file

Report

SHASTA-NLK-XXC FABMASTER (R) licence #9047 ASUSTEK COMPUTER INC.

Test    Fixture   Nails    Nails 2492/6028  Selected  Drill      26-Aug-05    10:51
2492    Nails,    1-81     New              INCH      units

| Net name | Suggestion | Priority |
|---|---|---|
| PCI_CK_33M_1_PC | Control pin of EEPROM | Absolutely necessary |
| | | |
| | | |
| | | |
| | | |
| | | |
| | | |
| | | |

Group of power test pads needed additional power test pads (safety value=5)

| Group name | Current total amount of power test pads | Amount of additional power test pads |
|---|---|---|
| +12V DIG | 7 | 0 |
| +5V AUX | 9 | 0 |
| -12V | 7 | 0 |
| +12V | 3 | 2 |
| +3.3V | 1 | 4 |
| +5V | 1 | 4 |
| GND | 448 | 0 |

Test pads having the interval violage of the requirement (safety distance=50mils)

| | Total: 4 |
|---|---|
| More detail link to | 50mil node list |

FIG. 7

METHOD OF DIAGNOSING CIRCUIT LAYOUT AND COMPUTER SYSTEM FOR PERFORMING THE SAME

BACKGROUND OF THE INVENTION

1. Field of Invention

This invention relates to circuit layout designs and, in particular, to a method of diagnosing a circuit layout and a computer system for performing the method, for diagnosing whether the arrangement of the test pads of the circuit layout is sufficient so as to prevent an essential test pad from being neglected and not established.

2. Related Art

To cooperate with an in-circuit test (ICT), the contemporary circuit layout must be designed for testing and function. This makes the final circuit board product have not only functional circuits, but also sufficient test pads for contacting with probes of the in-circuit tester, so as to test whether the function and quality of the circuit board are correct.

In particular, some essential test pads may not be established in the final circuit layout, so that some items tested with the in-circuit tester may receive test errors, since the final circuit board product lacks the necessary test pads. To solve this problem, it usually necessary to manually test whether the finished circuit layout is missing the test pad or test pads, before the fabrication of the film. Thus, the finished circuit board product manufactured according to the circuit layout can have enough test pads for the requirement of in-circuit test.

However, since the circuit layout is manually tested, the testing procedure is time and personnel consuming. Moreover, the accuracy of manually testing is poor. Accordingly, the related art fails to completely or effective solve the above-mentioned problem of neglecting test pads.

SUMMARY OF THE INVENTION

The present invention provides a method for diagnosing a circuit layout and a computer system for perform the method, wherein the computer system can rapidly diagnose whether the arrangement of the test pads on the circuit layout matches the anticipated arrangement, so that the circuit board product fabricated according to the diagnosed circuit layout can have enough test pads to fulfill the requirements of the in-circuit test.

The circuit layout includes a plurality of pin pads, a plurality of test pads, and a plurality of nets connecting the pin pads and the test pads. All data of the pin pads, the test pads, and the nets are defined in at least one first file.

In order to test whether the arrangement of the test pads on the circuit layout matches the anticipated arrangement, a layout arranging rule is first established to regulate the fundamental requirements of the circuit layout. The layout arranging rule is specifically defined in a second file. Therefore, a computer system can be used to read the contents of the first and second files, and then execute a diagnosing program to compare the first and second files. Accordingly, any violation of the layout arranging rule by the circuit layout can be found by comparing the first and second files. For example, the layout arranging rule defined in the second file records the names of the pin pads and whether the pin pad or pin pads are absolutely necessarily connected to the test pad or test pads. The first file records the name of each of the pin pads and the connection status of each of the pin pads, showing whether the pin pads are connected to the test pads. Once the first file is read, the executed diagnosing program can find out which pin pad in the circuit layout is regulated to be absolutely necessarily connected to the test pad and is actually unconnected to any test pad.

Besides, since the first file records the actual details of the circuit layout, the diagnosing program, under a proper design, can further search the first file and determine which test pad is a power test pad, which power test pads belong to the same group, and which group of the power test pads has a total number of power test pads which is less than a safety value, and therefore requires an additional power test pad.

Similarly, the diagnosing program, under a proper design, can further determine the shortest interval between two neighboring test pads, and which test pads have an interval less than a safety distance and therefore need to be amended.

The invention uses a computer system to read the first and second files and to execute the diagnosing program, so that the improper arrangement of the test pads in the circuit layout can be found rapidly. Finally, a report recording the diagnosing results is generated. A user designing the circuit layout can improve their design by using this report. Thus, circuit board products, which fit the requirements for both function and testing capabilities, are obtained.

Compared with the conventional manual testing of a circuit layout, the present invention provides a computer system to perform a diagnosis (testing) of the circuit layout, which makes the diagnosing procedure faster and more accurate, and therefore saves more personnel and time. Thus, the present invention is highly useful and non-obvious.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein.

DETAILED DESCRIPTION OF THE INVENTION

Figure 1:
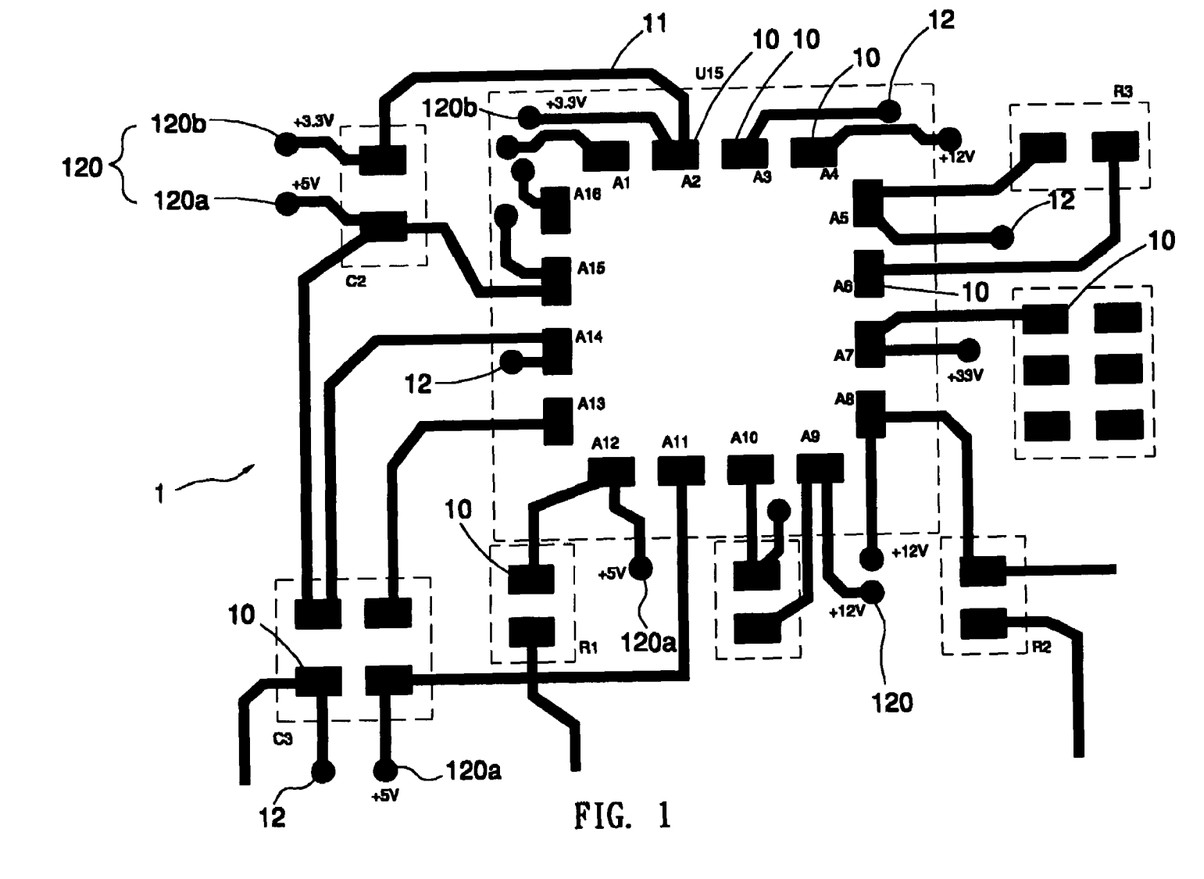
FIG. 1 is a partial enlarged view showing a portion of a circuit layout according to a preferred embodiment of the invention.

The circuit layout 1 shown in FIG. 1 is taken as an example to describe how the method and computer system, according to a preferred embodiment of the invention, test whether the requirements necessary for testing of the circuit layout 1 are sufficient. Although FIG. 1 only shows a portion of the circuit layout 1, those who skilled in the art should know that the illustrated portion of the circuit layout 1 is sufficient to present the whole circuit layout 1 and to support the following description.

The circuit layout 1 includes a plurality of pin pads 10, a plurality of nets 11 for connecting the pin pads 10, and a plurality of test pads 12 for testing. The test pads 12 are respectively connected to the corresponding pin pads 10 via the nets 11. The test pads 12 further include a plurality of groups of power test pads 120, which relate to the power input. Each group of the power test pads 120 has a different level input voltage. For example, the group of the power test pads 120a has a group name of "+5V" and is used at a voltage of +5V. The group of the power test pads 120b has a group name of "+3.3V" and is used at a voltage of +3.3V.

Figure 2:
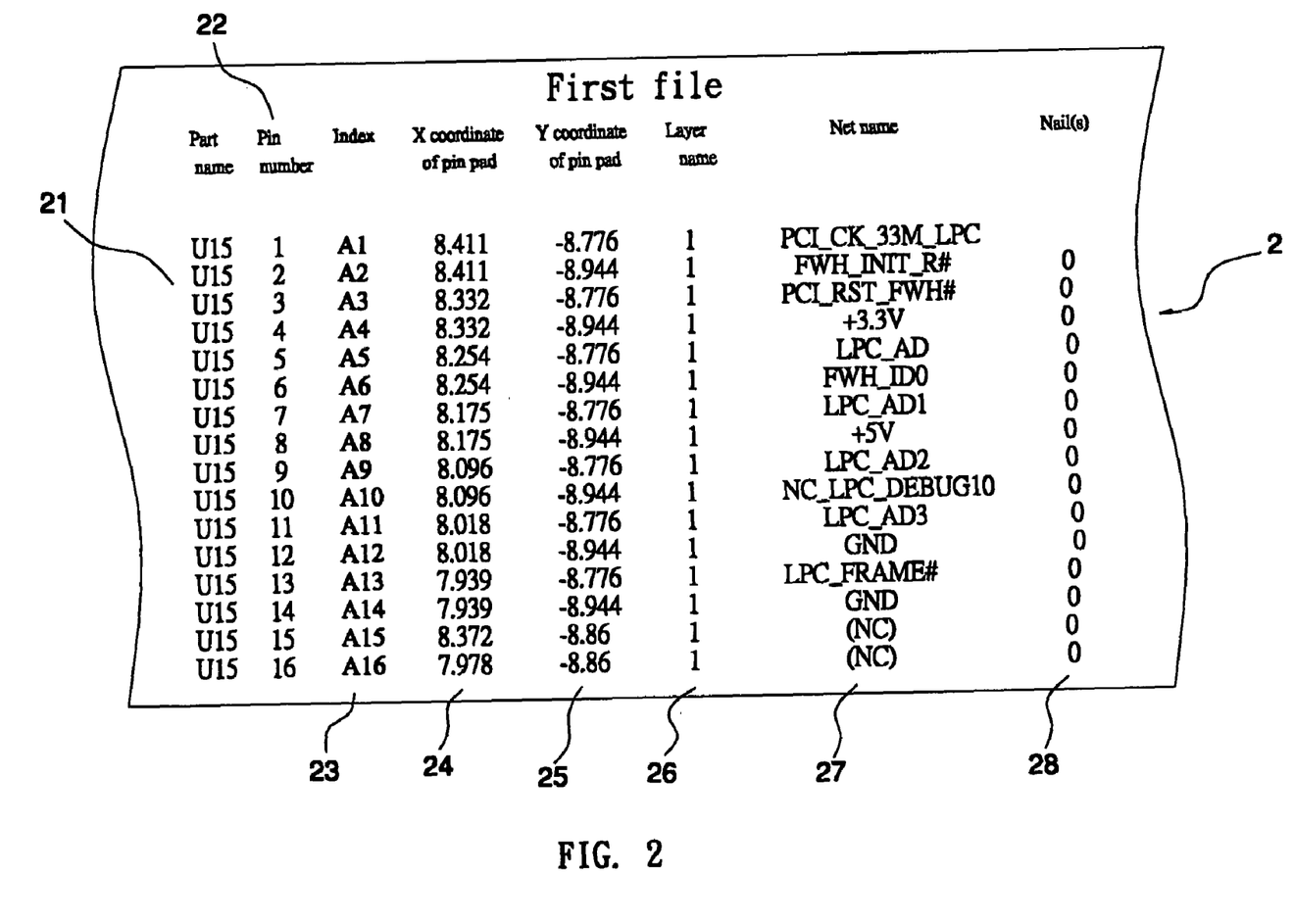
FIG. 2 is a schematic illustration showing a portion of the content of the first file according to the preferred embodiment of the invention.

Although the circuit layout 1 is a graphic file generated using layout software, the information in the graphic file circuit layout 1 (as shown in FIG. 1), such as the names, coordinates, numbers, areas, and other details for the pin pads 10, nets 11, test pads 12 and power test pads 120, can be transformed into one or more text files. This transformation function is usually provided by the present layout software. The first file 2 shown in FIG. 2 is an illustration showing a transformed text file using the present layout software. The first file 2 shows the column titles including the part name 21, the pin number 22, the index 23, the X coordinate of the pin pad 24, the Y coordinate of the pin pad 25, the layer name 26, the net name 27, and the nail(s) 28, wherein the index 23 refers to the name of the pin pad, and the nail(s) 28 refer to whether the pin pad 10 is connected to the corresponding test pad 12. In the first file 2, the value of nail(s) 28 is "0" when the pin pad 10 is connected to the test pad 12, and the value of nail(s) 28 is blank when the pin pad 10 is unconnected to the test pad 12.

Figure 3:
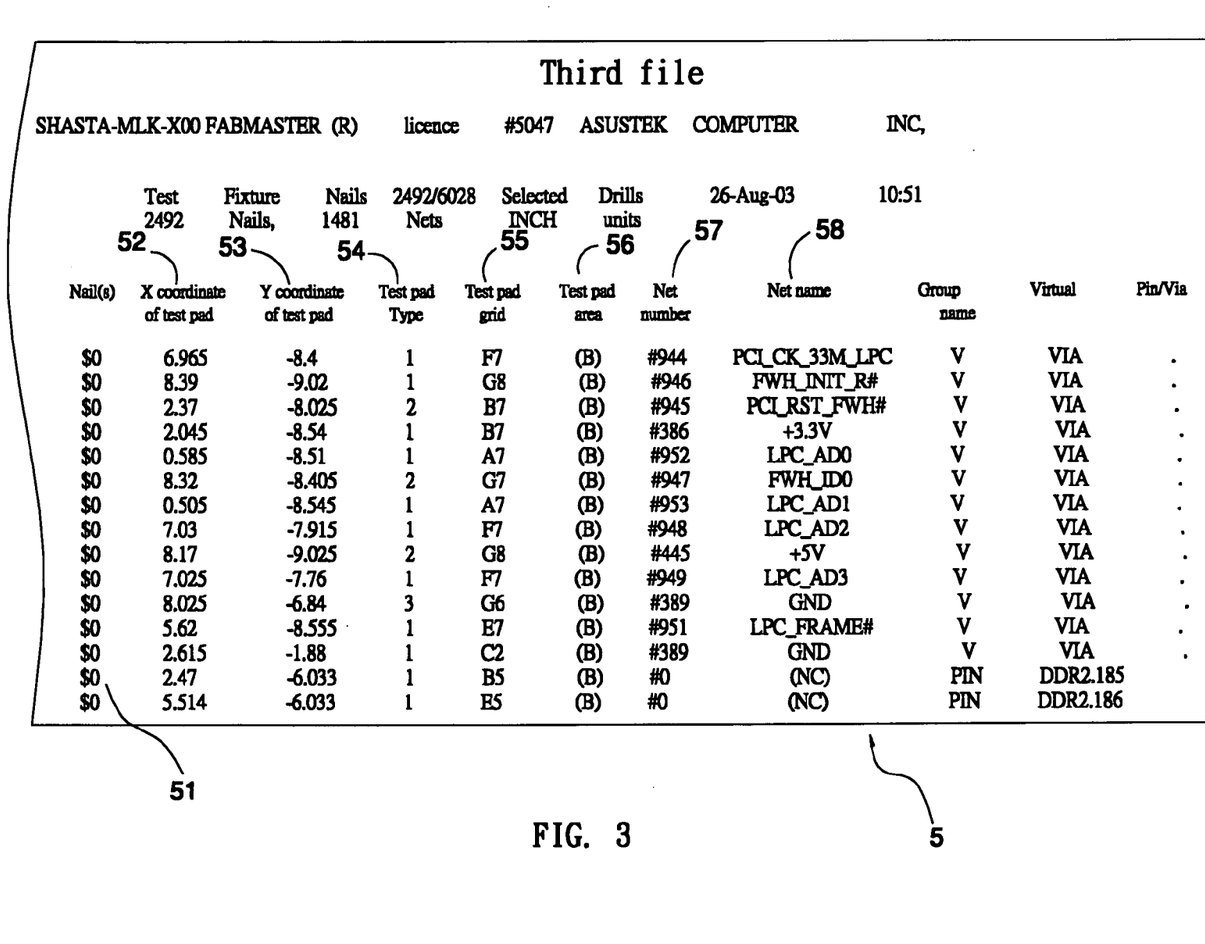
FIG. 3 is a schematic illustration showing a portion of the content of the third file according to the preferred embodiment of the invention.

FIG. 3 shows a third file 5, which is also a transformed text file generated by present layout software and which corresponds to the circuit layout 1. The third file 5 lists the column titles, such as the nail(s) 51, the X coordinate of the test pad 52, the Y coordinate of the test pad 53, the test pad type 54, the test pad grid 55, the type of test pad area 56, the net number 57, the net name 58, and other information (or data) thereof.

Figure 4:
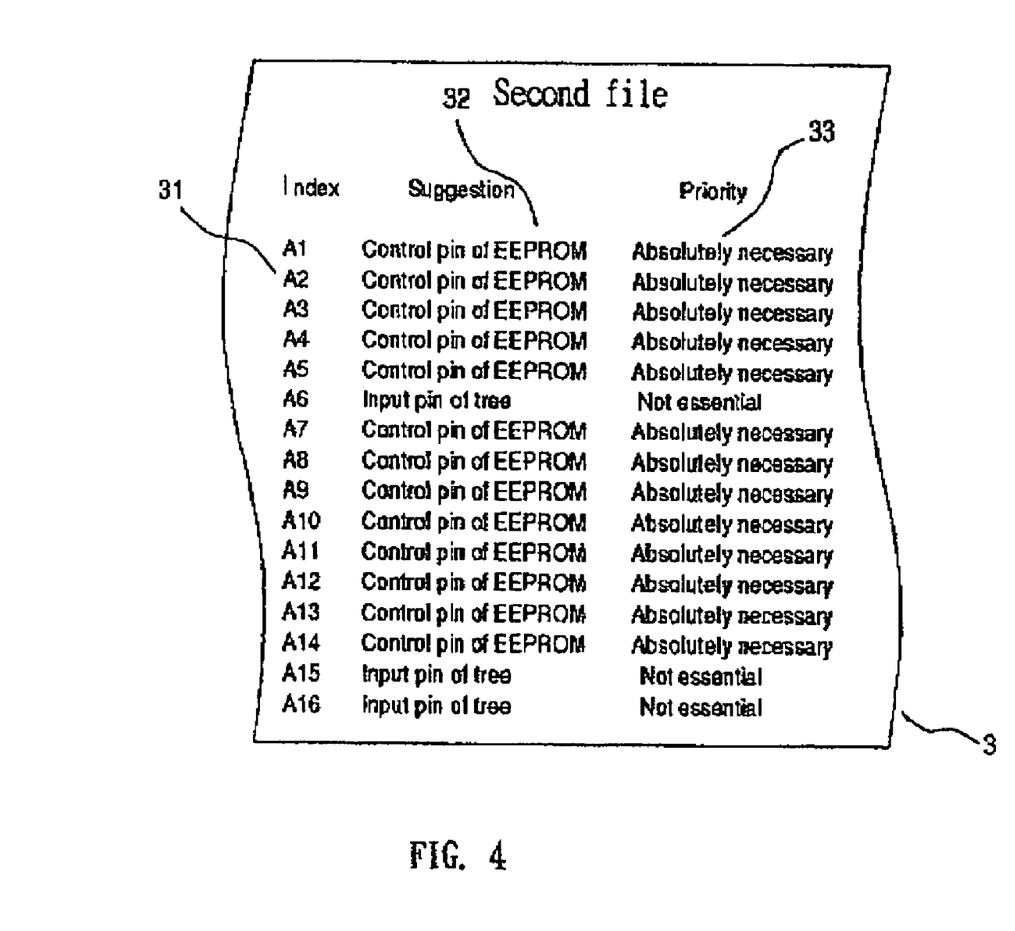
FIG. 4 is a schematic illustration showing a portion of the content of the second file according to the preferred embodiment of the invention.
Figure 5:
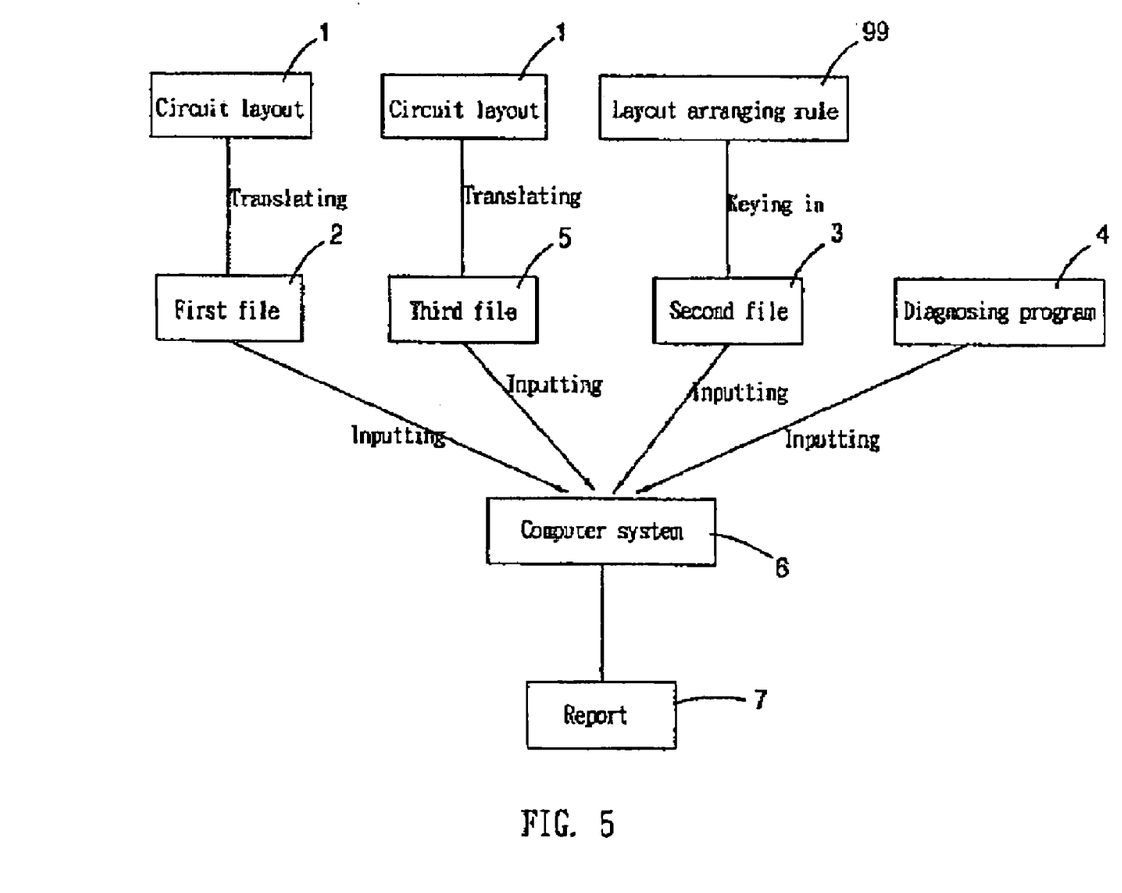
FIG. 5 is a block diagram showing an overview according to the preferred embodiment of the invention.

As shown in FIG. 4, the second file 3 records the column titles, such as the index 31, the suggestion 32, and the priority 33, and the information (or data) thereof. As shown in FIG. 5, the information is the layout arranging rule 99 is established according to the test requirements. The information corresponding to the priority 33 represents whether it is absolutely necessary to connect one pin pad 10 (as shown in FIG. 1) to one test pad 12 (as shown in FIG. 1). For example, the pin pad 10 labeled A2 is defined as "Absolutely necessary", while the pin pad 10 named A6 is labeled as "Not essential".

A safety value and a safety distance are established according to the layout arranging rule 99. The safety value and the safety distance are defined in a diagnosing program 4.

With reference to FIG. 5, the first file 2, the third file 5, the second file 3, and the diagnosing program 4 are all inputted into a computer system 6. In the current embodiment, the computer system 6 performs diagnosing program 4, in order to diagnose whether the circuit layout 1 matches the layout arranging rule 99, as follows:

1. The pin pad 10, which is defined as "Absolutely necessary" to be connected to the test pad 12, must be connected to one test pad 12 in the circuit layout 1.
2. The total number of the power test pads 120 in each group of the circuit layout 1 must be greater than 5.
3. The interval between two neighboring test pads 12 must be longer than 50 mils.

According to the preferred embodiment of the invention, the computer system 6 includes at least a central process unit (CPU) and a storage unit which is used to read the first file 2, the third file 5, and the second file 3, and to execute the diagnosing program 4. Thus, portions of the information recorded in the first file 2 which violate the layout arranging rule 99 are picked out. Also, the test pads recorded in the third file 5 which have the same group name, and which violate the safety value and the safety distance defined in the diagnosing program 4, are also noted. The first file 2 and the third file 5 can represent the actual details of circuit layout 1, and the safety value and the safety distance defined in the diagnosing program 4 can represent the layout arranging rule 99 of the circuit layout 1. Accordingly, after the testing procedures described above, any portion of the circuit layout 1 which violates the layout arranging rule 99 would be discovered by the computer system 6 and then listed in a report 7.

Figure 6:
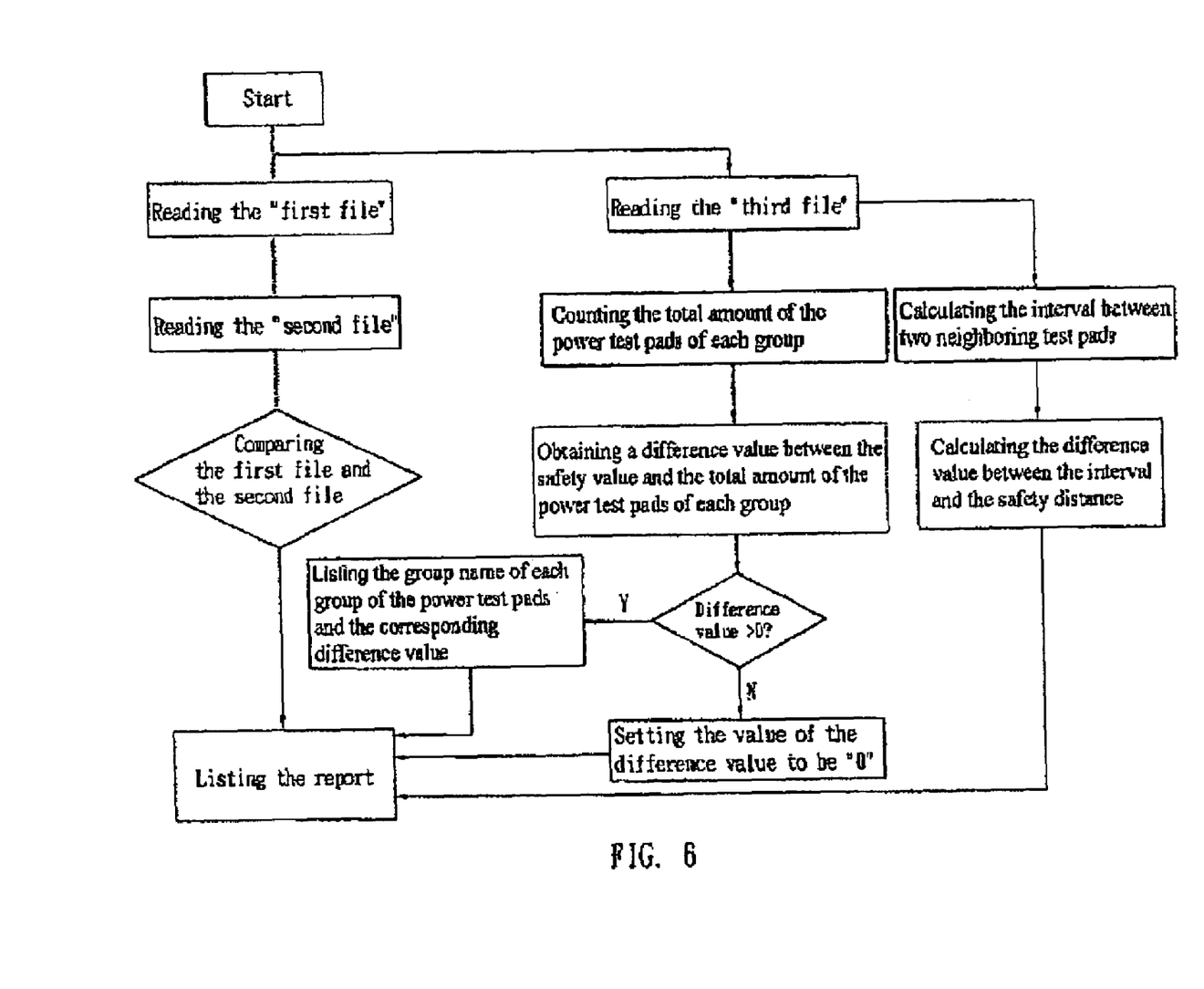
FIG. 6 is a flow chart showing the method of diagnosing a circuit layout with a computer system according to the preferred embodiment of the invention.

More specifically, the computer system 6 can perform the following steps to diagnose whether the circuit layout 1 matches the anticipated requirements of the layout arranging rule 99. Referring to FIG. 6, the steps include:

Reading the first file 2, which was previously obtained;
Reading the second file 2, which was previously established;
Executing the diagnosing program 4 to compare the contents of the first file 2 and the second file 3 so as to find the differences in information between the first file 2 and the second file 3, and, for example, to find the portion of the circuit layout 1 which violates the layout arranging rule 99;
Listing the pin pad 10 which violates the layout arranging rule 99 and which requires connection with an additional test pad 12;
Reading the third file 5, which was previously obtained;
Executing the diagnosing program 4 to count the total number of the power test pads in each group, and, for example, to determine each power test pad 120 inside the third file 5 and count the total number of power test pads with the same group name;
Obtaining a difference value between the previously obtained safety value and the total number of power test pads in each group; and
Determining whether the difference value is greater than zero, and, when the difference value is greater than zero, the data of the difference value is set as "0". When the difference value is not greater than zero, the difference value and the name of this group of power test pads 120 are listed in the report.

In addition, the diagnosing program 4 may be further executed to calculate the interval between two neighboring test pads 12; and to list the test pads 12 having an interval of less than the safety distance. The safety distance is 50 mils in the present embodiment.

The diagnosing program 4 is then executed to generate a report 7, which lists each pin pad 10 in the circuit layout 1 which violates the layout arranging rule 99 and requires connection with an additional test pad 12, the name of each group of the power test pads 120, the corresponding difference value, and the test pads 12 which have an interval of less than the safety distance.

Since the first file 2 and the second file 3 are both in Excel format, the diagnosing program 4 can be written by the VBA program language. For example, according to the value corresponding to the column labeled nail(s) 28 (shown in FIG. 2), the pin pad 10, which is unconnected to any test pad 12, is sought out from the first file 2. Afterwards, the searched pin pads 10 and the values corresponding to the column labeled priority 33 of the second file 3 are compared one by one. Thus, the pin pad 10, which is the pin pad 12 shown as being "Absolutely necessary" to be connected to the test pad 12 and is actually unconnected to any test pad 12, is found.

The diagnosing program 4 can also find the power test pads 120 with the same group name, such as "+5V", and count the total number of the power test pads in each group. The total number is then compared with the safety value so as to determine which group has the total number that is insufficient and requires the additional power test pad 120. As shown in FIG. 3, the total number of the power test pads 120 having the same group name of "+5V" is "1," which is less than the anticipated safety value, such as "5". Thus, 4 additional power test pads 120 are required for this group of power test pads 120.

The diagnosing program 4 can further calculate the difference value between the interval and the safety distance according to the recorded information of the test pad 12 such as the columns titled with the X coordinate of the test pad 52, the Y coordinate of the test pad 53, the test pad type 54, the test pad grid 55, the test pad area 56, and the group name 58 in the third file 5. The diagnosing program 4 can then determine which test pads 12 having interval violated the requirements, such as lower than 50 mils.

Figure 7:
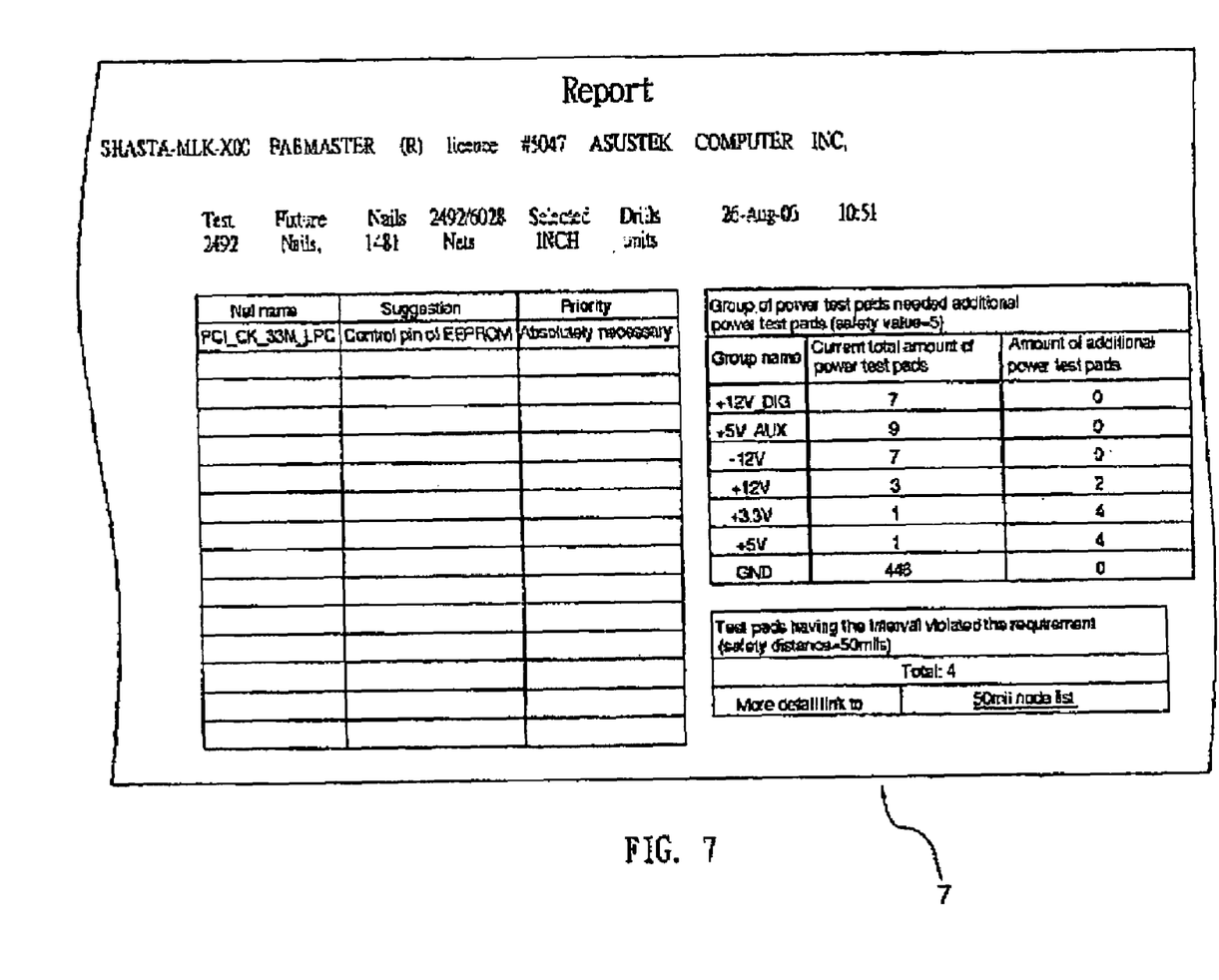
FIG. 7 is a schematic illustration showing the content of the finally report according to a preferred embodiment of the invention.

Finally, the diagnosing program 4 can generate a report 7, which is in Excel format, so as to receive and to record the diagnosing results described above. With reference to FIG. 7, the substantial content of the report 7 is shown and includes three portions, wherein:

The first portion is used to represent which pin pad 10 is absolute necessarily to be connected to the addition test pad 12, and, for example, the pin pad 10 with the group name of "PCI-CK-33M-LPC" is the one that should be connected to the addition test pad 12;

The second portion is used to represent which group of the power test pads 120 has the total number less than the safety value, such as "5", and needs the additional power test pad 120, and, as shown in FIG. 7, the total number of the power test pads 120 with the group name of "+5V" is 1 and less than the safety value, such as "5", so that 4 additional power test pads 120 are required; and The third portion is used to represent which test pads 12 have the interval less than the safety distance, such as "50 mils", and need an increased interval, and, as shown in FIG. 7, there are four test pads 12 which violate the requirement.

It should be noted that the information (or data) presented in the third file 5 could be included in the first file 2. In other words, the definitions of the circuit layout 1 can be completely recorded in the first file 2. Accordingly, the diagnosing program 4 can be performed according to the first file 2 with appropriate additional column(s), so as to obtain the information stated in the first, second, and third portions of the report 7.

In the present embodiment of the invention, the computer system 6 is used to read the previously-obtained first file 2 and the previously-established second file 3, and then executes the diagnosing program 4, which functions to compare, sort, search build files, and the like. Thus, the portion of the circuit layout 1 which does not match the anticipated requirement is found by comparing the content of the first file 2 and the second file 3. By the means of this computerized testing, the circuit layout 1 can be rapidly and accurately tested so as to find out whether the circuit layout 1 matches the design requirements for testing, and, in particular, the test pin arrangement.

Compared with the conventional, manual testing of a circuit layout, the present invention uses a computer system to process diagnosing of the circuit layout. Therefore, the diagnosing method of the invention is much faster and more accurate, and uses less manpower and time, thereby making this invention both useful and non-obvious.

Moreover, there is no disclosure, which is the same as or similar to the invention in the field, disclosed in prior, and the invention could be thus patentable and is filed.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method of diagnosing a circuit layout using a computer system, comprising the steps of:

generating at least one first file, the first file containing data for a circuit layout, including data for pin pads, test pads, and nets which connect the pin pads and the test pads, wherein the test pads have a plurality of power test pads, and the power test pads are divided into several groups, each group having a different group name and input voltage;

generating a second file, the second file establishing a layout arranging rule;

defining a safety value for each group of the power test pads according to the layout arranging rule; and comparing the first file and the second file to determine whether the circuit layout of the first file violates the layout arranging rule of the second file, wherein the comparing step comprises:

searching the first file and counting the total number of power test pads in each group;

calculating the difference value between the total number of power test pads and the safety value for each group, wherein, if the difference value is greater than or equal to zero, the difference value is reset to zero; and generating a report which demonstrates the results of the comparing, searching and calculating steps.

2. The method of claim 1, wherein the report indicates whether the circuit layout violates the layout arranging rule.

3. The method of claim 1, wherein the first file indicates the name and connection status of each pin pad and the connection status indicates whether each pin pad is connected to one of the test pads, and wherein the second file indicates the priority of the pin pads.

4. The method of claim 3, wherein the report indicates whether the connection status is inconsistent for each pin pad between the first and second file.

5. The method of claim 1, wherein the report indicates the group name and difference value for each group of power test pads which violate the layout arranging rule of the second file.

6. The method of claim 1, further comprising:
listing a coordinate value for each test pad in the first file;
defining a safety distance;
calculating an interval between two neighboring test pads using the coordinate values; and
calculating the difference value between the safety distance and the interval.

7. The method of claim 6, wherein the report indicates the group name and difference value for each power test pads, and indicates which test pads have an interval less than the safety distance.

8. The method of claim 6, wherein the first file indicates:
the name of each pin pad;
the connection status of each pin pad, wherein the connection status indicates whether each pin pad is connected to one of the test pads;
the group name for each group of the power test pads;
a coordinate value for each of the test pads; and
the test pad area.

9. The method of independent claim 1, wherein the safety value is defined using a diagnosing program.

10. A computer system, comprising:
at least one central processing unit;
at least one storage unit which stores a diagnosing program for diagnosing a circuit layout, wherein the circuit layout comprises a plurality of pin pads, a plurality of test pads, and a plurality of nets connecting the pin pads and the test pads, and wherein the test pads have a plurality of power test pads, and the power test pads are divided into several groups, each group having a different group name and input voltage;
a first file defining data of the pin pads, the test pads, and the nets; and
a second file defining a layout arranging rule;
wherein the diagnosing program compares the first file and the second file to determine whether the circuit layout of the first file violates the layout arranging rule of the second file, specifies a plurality of safety values for each group of power test pads, searches the first file and counts the total number of power test pads in each group, and calculates the difference between the total number of power test pads and the safety value for each group, wherein, if the difference value is greater than or equal to zero, resets the difference value to zero, and generates a report which demonstrates the results of the comparison, search, and calculation.

11. The computer system of claim 10, wherein the report indicates whether the circuit layout violates the layout arranging rule.

12. The computer system of claim 10, wherein the first file further contains the name and connection status of each pin pad and the connection status shows whether each pin pad is connected to one of the test pads, and wherein the second file further indicates the priority of the pin pads.

13. The computer system of claim 12, wherein the report indicates whether the connection status is inconsistent for each pin pad between the first and second file.

14. The computer system of claim 10, wherein the report indicates the group name and difference value for each group of power test pads which violate the layout arranging rule of the second file.

15. The computer system of claim 10, wherein the first file has a coordinate value listed for each test pad; and
wherein a safety distance is defined, an interval is calculated between two of the neighboring test pads and a difference value is calculated between the safety distance and the interval.

16. The computer system of claim 15, wherein the report contains the group name and difference value for each power test pad, and indicates which test pads have an interval less than the safety distance.

17. The computer system of claim 15, wherein the first file further contains:
the name of each pin pad;
the connection status of each pin pad, wherein the connection status indicates whether each pin pad is connected to one of the test pads;
the group name for each group of the power test pads;
a coordinate value for each of the test pads; and
the test pad area.

* * * * *